(12) United States Patent
Roellgen et al.

(10) Patent No.: US 7,911,198 B2
(45) Date of Patent: Mar. 22, 2011

(54) ARRANGEMENT AND METHOD FOR MEASURING A CURRENT FLOWING IN AN ELECTRICAL CONDUCTOR

(75) Inventors: Bernhard Roellgen, Munich (DE); Martin Neudecker, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/698,718

(22) Filed: Feb. 2, 2010

(65) Prior Publication Data

US 2010/0181991 A1    Jul. 22, 2010

Related U.S. Application Data

(63) Continuation of application No. PCT/EP2008/060100, filed on Jul. 31, 2008.

(30) Foreign Application Priority Data

Aug. 3, 2007    (DE) .......................... 10 2007 036 674

(51) Int. Cl.
   *G01R 33/00*    (2006.01)
(52) U.S. Cl. ............................... 324/117 H; 324/117 R
(58) Field of Classification Search .................. None
   See application file for complete search history.

(56) References Cited

U.S. PATENT DOCUMENTS

| | | | |
|---|---|---|---|
| 4,059,798 A | * | 11/1977 | Dierker et al. ................ 324/127 |
| 6,411,078 B1 | * | 6/2002 | Nakagawa et al. ....... 324/117 H |
| 7,332,903 B2 | | 2/2008 | Hausperger et al. |
| 7,541,799 B2 | | 6/2009 | Hausperger et al. |
| 7,579,825 B2 | * | 8/2009 | Hausperger et al. ...... 324/117 H |
| 2006/0290341 A1 | | 12/2006 | Hausperger et al. |
| 2007/0052407 A1 | | 3/2007 | Hausperger et al. |

FOREIGN PATENT DOCUMENTS

| | | |
|---|---|---|
| DE | 41 13 496 A1 | 10/1992 |
| DE | 10 2006 016 745 A1 | 10/2006 |
| DE | 10 2005 040 316 A1 | 3/2007 |
| DE | 10 2005 024 075 B4 | 4/2007 |
| DE | 10 2007 025 505 A1 | 12/2008 |
| EP | 1 067 391 A1 | 1/2001 |
| EP | 1 762 852 A2 | 3/2007 |
| WO | WO-2008/145686 A1 | 12/2008 |

* cited by examiner

*Primary Examiner* — Minh N Tang
(74) *Attorney, Agent, or Firm* — Slater & Matsil, L.L.P.

(57) ABSTRACT

An arrangement and a method are used for measuring current flowing in an electrical conductor with a magnetic circuit that has an air gap for coupling to the electrical conductor. The air gap of the magnetic circuit contains a magnetic-field-sensitive component that is used to measure the magnetic field generated by the electrical conductor, wherein, the air gap of the magnetic circuit contains a control core, wherein the control core has a control winding for the magnetic saturation of the control core. In the vicinity of the magnetic-field-sensitive component there are several additional elements that are suitable for conducting interfering magnetic fields in the surroundings of the magnetic-field-sensitive component independent of the control cores.

20 Claims, 1 Drawing Sheet

ARRANGEMENT AND METHOD FOR MEASURING A CURRENT FLOWING IN AN ELECTRICAL CONDUCTOR

This application is a continuation of co-pending International Application No. PCT/EP2008/060100, filed Jul. 31, 2008, which designated the United States and was not published in English, and which claims priority to German Application No. 10 2007 036 674.6 filed Aug. 3, 2007, both of which applications are incorporated herein by reference.

BACKGROUND

German patent publication DE 10 2005 024 075 B4 discloses a device for measuring a current flowing in an electrical conductor.

SUMMARY

Aspects of the present invention specify an arrangement and a method for measuring a current flowing in an electrical conductor, making possible a correct measurement independent of external magnetic influences.

The arrangement has a magnetic circuit provided with an air gap for coupling to an electrical conductor. The air gap of the magnetic circuit contains a control core that is provided to control the air gap. The control core has a control winding for its magnetic saturation. The air gap of the magnetic circuit contains a magnetic-field-sensitive component for measuring the magnetic field generated by the electrical conductor. The magnetic-field-sensitive component is arranged on one side of the control core. In one embodiment, a second magnetic-field-sensitive component could be arranged on the side of the control core opposite the first magnetic-field-sensitive component. In the vicinity of the first magnetic-field-sensitive component, there are several additional elements. These elements are suitable, independent of the control core, for conducting magnetic fields in the surroundings of the magnetic-field-sensitive component.

In a preferred embodiment, a first element is arranged inside of the control core, a second element outside of the control core.

The control core is preferably arranged in the air gap of the magnetic circuit, so that gaps are produced at the top and bottom between the control core and the magnetic circuit.

In another embodiment, the air gap is arranged asymmetrically, so that preferably different size gaps are produced at the top and bottom between the control core and the magnetic circuit.

The elements located in the vicinity of the control core can be preferably magnetizable.

Preferably, the additional elements have a relative permeability that is greater than 1.

For the additional elements, in particular, soft-magnetic materials are suitable that exhibit a relative permeability that is greater than or equal to the relative permeability of the control core. Materials that are also used for the control core are particularly suitable for this purpose.

The additional elements are preferably arranged in the vicinity of a first magnetic-field-sensitive component, so that possible magnetic interference fields can be effectively focused in the vicinity of the magnetic-field-sensitive component and can be fed through the magnetic-field-sensitive component.

In one embodiment, it is also possible that the elements are constructed as an integral component of a one-piece control core. Here, bulging of the control core and a thicker section of the control core in the near field of the magnetic-field-sensitive component is possible, so that the smallest possible air gap is produced between one of the additional elements and the magnetic-field-sensitive component.

The areas of the thicker section or bulging of the control core still exhibit a residual permeability even in the case of saturation of the control cores.

In another embodiment, the additional elements are made from several individual parts that could each be combined into one additional element.

Preferably, in the case of complete saturation of the control core by the control windings, the additional elements exhibit a residual permeability, so that interfering magnetic fields can be further focused by the additional elements even for saturation of the control core and can be fed through the magnetic-field-sensitive component.

In a preferred embodiment, the additional elements are made from ferromagnetic material, for example, a ferrite, a nanocrystalline metal alloy, or from Permalloy. However, other materials that exhibit ferromagnetic properties are also suitable.

In one embodiment, the magnetic circuit has an additional winding. By means of the additional winding, the magnetic circuit could be magnetized by a short current pulse. After the current pulse, the magnetic circuit has a defined remanence that can be used for setting the zero point.

In order to allow a reliable measurement of the current flowing in the electrical conductor, the magnetic circuit is able to completely surround the electrical conductor in its cross section.

In one preferred embodiment, the control core is constructed as a ferrite core. Here, the ferrite core is constructed in an especially preferred way as a rectangular frame that has a control winding for the saturation of the ferrite core on at least one side of the frame. In one especially efficient embodiment, control windings are arranged on two opposite sides of the frame. Through the construction of the control core in this form, an efficient saturation of the control core can be achieved.

Therefore, because only one control core is arranged in the magnetic circuit, this can have, in comparison with a structure with two control cores, more than twice the number of windings on the control core, so that for the same wire diameter of the control windings, twice the number of ampere windings are available. This allows for the measurement of very large currents, without the control cores being driven from saturation by the primary current. In the case of very large currents lying in the range of approximately 1000, the primary current would counteract the control current in one of the legs of the control core and thus drive it from saturation.

The magnetic-field-sensitive component is preferably a Hall sensor.

If current flows through a Hall sensor and if this sensor is moved into a magnetic field running perpendicular to the sensor, the sensor delivers an output voltage that is proportional to the product of the magnetic field intensity and the current.

For determining the current flowing in the electrical conductor, different measurements are performed with the aid of the Hall sensor.

The problem named above is also solved by a method for measuring a current flowing in an electrical conductor. For example, a magnetic circuit can be coupled with the electrical conductor. The magnetic circuit has an air gap and a control core arranged in the air gap for controlling the air gap. A first magnetic field is measured in the case of a saturated control core through one or more magnetic-field-sensitive components arranged in the air gap. A second magnetic field is measured in the case of an unsaturated control core through the one or more magnetic-field-sensitive components. Interference influences of external magnetic fields can be eliminated by balancing out the interference influences both for the measurement of the first magnetic field and also for the measurement of the second magnetic field through additional elements that are suitable, independent of the control core, for conducting magnetic fields in surroundings of a magnetic-field-sensitive component.

Magnetic fields in the surroundings of the magnetic-field-sensitive component that are not generated by the electrical conductor or the control winding can degrade the measurements to a considerable extent.

A first measurement is performed in the case of a saturated control core, another in the case of an unsaturated control core. Through the additional magnetizable elements that are mounted on the outside, external magnetic interference fields are influenced such that contributions of external magnetic interference fields can be balanced out and thus can be eliminated in the equations for calculating the current intensity.

The first additional element in the interior of the control core is needed in order to increase the sensitivity for external magnetic fields in the case of saturation of the control core, so that the contributions of external magnetic interference fields balance out in the equations for calculating the current intensity.

Preferably, there is an air gap between the control core and the magnetic circuit at the top and bottom. The additional air gap below the control core supports the effect of the additional element that is mounted on the outside and that is made from magnetizable material. In the air gap below the control core, there can be another magnetic-field-sensitive component between the control core and the magnetic circuit. Through parallel reading and averaging of the measurement values or the measurement results, the measurement accuracy can be increased.

From the two measurements for a saturated and an unsaturated control core, under consideration of certain factors that result through the sensitivity of the Hall sensor in the case of a saturated and an unsaturated control core, respectively, the current intensity of the current flowing through the electrical conductor can be calculated by means of known equations.

Through the newly added elements made from preferably soft-magnetic material, interference influences due to external magnetic fields can be eliminated in the equations, both in the case of a saturated control core and also in the case of an unsaturated control core, since these contributions can be balanced out to each other by the additional elements. Therefore, the system of linear equations can be solved in a simple way and the current intensity of the electrical conductor can be determined.

Through the additional elements mounted both within and also outside of the control core, the incident angles for external magnetic interference fields are equalized for the case of a saturated as well as an unsaturated control core. In this case, the contributions of the external interference magnetic fields cancel out and the current intensity can be determined through the simple subtraction of the two equations.

In the measurement, physical parameters are often converted into analogous electrical parameters. In the quantization, the measurement range of the analog parameters is divided into a finite number of consecutive sub-ranges (intervals) and a value of a finite symbolic system is assigned to each of these intervals (e.g., a whole number). The resolution is specified as the number of sub-ranges being used for the analog parameters, in the case of binary symbolic systems, also their power of two (resolution in bits), but in the case of equally large intervals, also the size of the intervals themselves.

The quantization steps reproduce the value for the measurement signal in discrete form.

Here, the following two equations are proposed:

$$R_{low}=n+S_{low}*I_{DC}+S_{Bl}*B*\sin(\alpha) \qquad \text{I.}$$

$$R_{high}=n+S_{high}*I_{DC}+S_{Bh}*B*\sin(\alpha) \qquad \text{II.}$$

In the above equations, $R_{low}$ indicates the number of quantization steps for the saturation of the control core. $R_{high}$ represents the number in the case of the unsaturated control core. The variable n indicates the zero point of the magnetic-field-sensitive component in quantization steps in which 0 A current is applied in the electrical conductor and 0 Tesla flux density is applied on the magnetic-field-sensitive component. The variables $S_{low}$ and $S_{high}$ indicate the sensitivity of the magnetic-field-sensitive component for a saturated and unsaturated control core, respectively. The variable B designates the magnetic flux density of an external magnetic field and the variable $\alpha$ indicates the angle from which the external magnetic field acts on the magnetic-field-sensitive component. The variable $I_{DC}$ indicates the current intensity of the conductor carrying a current, wherein this current intensity is to be determined by the measurement.

The additional, preferably soft-magnetic elements arranged in the vicinity of the magnetic-field-sensitive component now allow the variables $S_{Bl}$ and $S_{Bh}$ to be balanced. Therefore, the system of linear equations for determining the current intensity $I_{DC}$ can be solved in a simple way.

Because $S_{Bl}$ and $S_{Bh}$ are identical and the incident angles of the external interference magnetic fields for the saturated and unsaturated control cores are identical due to the construction described above, $I_{DC}$ can be determined through the subtraction of the equation (I) from the equation (II) or vice versa.

$$I_{DC}=(R_{low}-R_{high})/(S_{low}-S_{high})$$

BRIEF DESCRIPTION OF THE DRAWINGS

The arrangement is explained in more detail below with reference to embodiments and the associated figures.

The drawings described below are not to be understood as true to scale. Instead, for improved representation, individual dimensions can be shown enlarged, reduced, or otherwise distorted.

Elements that are identical to each other or that perform the identical function are designated with identical reference symbols.

FIG. 1 shows an example arrangement for measuring a current flowing in an electrical conductor; and FIG. 2 shows a cutout of an example arrangement for measuring a current flowing in an electrical conductor.

The following list of reference symbols may be used in conjunction with the drawings:

| | |
|---|---|
| 1 | Electrical conductor |
| 2 | Magnetic circuit |
| 3 | Air gap |
| 4 | Magnetic-field-sensitive component |
| 5 | Control core |
| 6 | Control winding |
| 7a, 7b | Additional elements |
| 8a, 8b | Gap |

DETAILED DESCRIPTION OF ILLUSTRATIVE EMBODIMENTS

Figure 1:
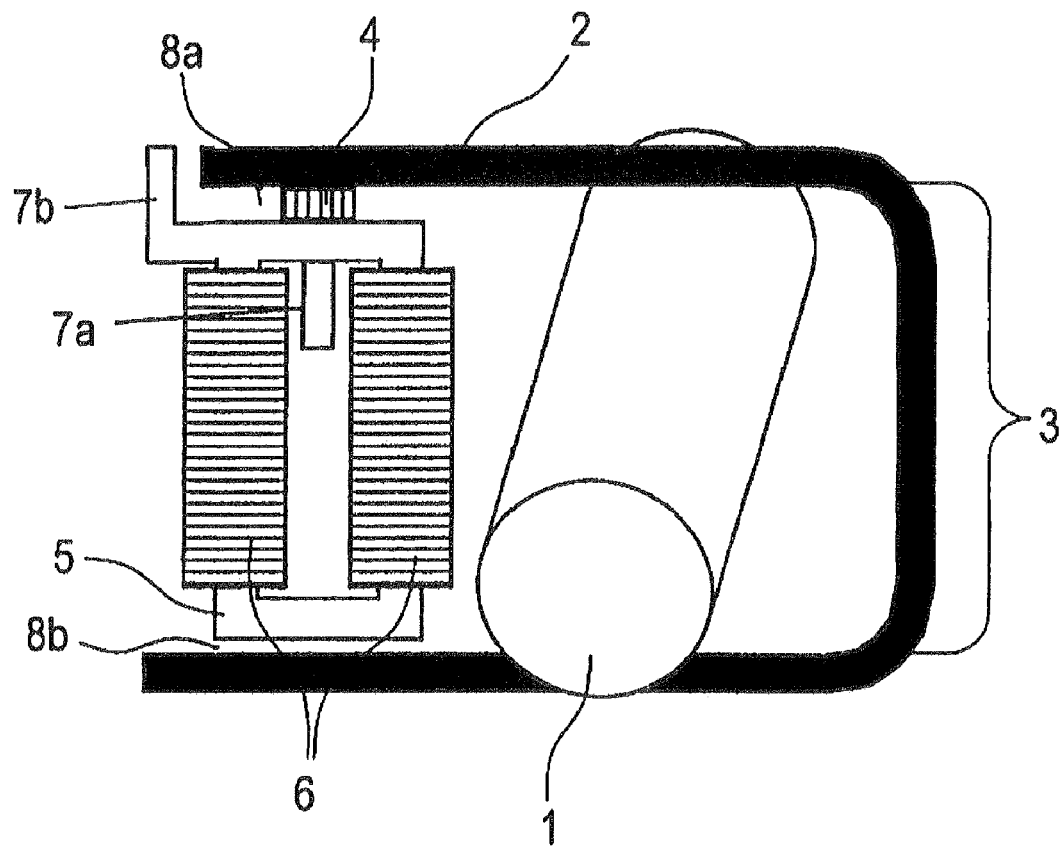

In FIG. 1, one possible embodiment of the example arrangement for measuring a current flowing in an electrical conductor 1 is shown in which a magnetic circuit 2 that can be made from ferrite surrounds an electrical conductor 1. The magnetic circuit 2 has, on one side, an air gap 3 in which a magnetic-field-sensitive component 4 is located. A control core 5 in the air gap 3 is used to control the air gap 3. The control core 5 is arranged in the middle in the air gap 3, so that a gap 8a, 8b is present on both sides of the control core 5 between the U-shaped magnetic circuit 2 and the control core 5. The magnetic-field-sensitive component 4 is arranged in the first gap 8a. The thickness of the magnetic-field-sensitive component 4 and the height of the gap 8a are approximately the same size, so that the magnetic-field-sensitive component 4 contacts both the magnetic circuit 2 and the control core 5. The control core 5 has control windings 6 that can bring the control core 5 into magnetic saturation. The control core 5 has, in the vicinity of the magnetic-field-sensitive component 4, additional magnetizable elements 7a, 7b. A first additional element 7a is preferably arranged within the control core 5. The additional element preferably has a rod-shaped construction. Another additional magnetizable element 7b is arranged specifically on the edge of the upper leg of the control core 5. The outer additional element 7b is thus arranged on the outside on the control core 5, wherein it can be formed in one preferred embodiment as a part of the control core 5. In the lower gap 8b, another magnetic-field-sensitive component 4 can be arranged in order to increase the measurement accuracy by a second measurement.

Figure 2:
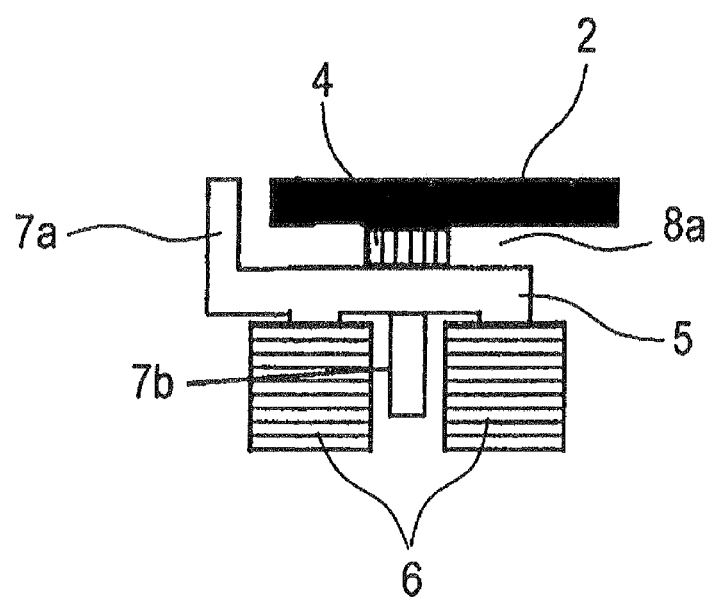

FIG. 2 shows a section of the example arrangement for measuring a current flowing in an electrical conductor 1 is shown. The section shows the area around the magnetic-field-sensitive component 4. The magnetic-field-sensitive component 4 is located in the gap 8a between the control core 5 and the magnetic circuit 2. The control core 5 has control windings 6 that are used for the saturation of the control core 5. In the vicinity of the magnetic-field-sensitive component 4 there are additional, magnetizable elements 7a, 7b that are preferably made from soft-magnetic material. A first additional element 7a is located within the control core 5 between the control windings 6. In one preferred embodiment, the additional element 7a has a rod-shaped construction. Another additional element 7b is arranged on the outside on the control core 5. The additional element 7b is preferably constructed as part of the control core 5. The additional magnetizable elements exhibit residual permeability also in the case of complete saturation of the control core 5. Through the two additional magnetizable elements 7a, 7b, the contributions of the interference external magnetic fields can be balanced out in the equations of the current flowing through the electrical conductor, so that the contributions can be canceled out in the equations.

Although only a limited number of possible refinements to the invention could be described in the embodiments, the invention is not limited thereto. In principle, it is possible to use a different number of control windings or a different form of the magnetic circuit for the arrangement. The invention is not limited to the number of schematically shown elements.

The description of the subject matters and methods specified here is not limited to the individual, special embodiments. Instead, the features of the individual embodiments, if technically useful, can be arbitrarily combined with each other.

What is claimed is:

1. An arrangement for measuring a current flowing in an electrical conductor, the arrangement comprising:
   a magnetic circuit with an air gap for coupling to the electrical conductor;
   a control core for controlling the air gap, the control core being arranged in the air gap, the control core having a control winding for magnetic saturation of the control core;
   a magnetic-field-sensitive component arranged in the air gap of the magnetic circuit for measuring a magnetic field generated by the electrical conductor, the magnetic-field-sensitive component being arranged on a first side of the control core; and
   a plurality of additional elements that are suitable for conducting magnetic fields in surroundings of the magnetic-field-sensitive component independent of the control core, the additional elements being located near the magnetic-field-sensitive component, wherein a first additional element is arranged within the control core and a second additional element is arranged outside of the control core.

2. The arrangement according to claim 1, further comprising a second magnetic-field-sensitive component arranged on a second side of the control core opposite the magnetic-field-sensitive component.

3. The arrangement according to claim 1, wherein the additional elements can be magnetized.

4. The arrangement according to claim 1, wherein the additional elements have a relative permeability of greater than 1.

5. The arrangement according to claim 1, wherein the additional elements are made from a soft-magnetic material.

6. The arrangement according to claim 1, wherein the additional elements have a relative permeability that is greater than or equal to a relative permeability of the control core.

7. The arrangement according to claim 1, wherein the additional elements have an arbitrary form or are each made from several individual elements.

8. The arrangement according to claim 1, wherein the additional elements comprise a portion of the control core.

9. The arrangement according to claim 1, wherein the additional elements have a residual permeability when the control core is saturated.

10. The arrangement according to claim 1, wherein the additional elements contain ferromagnetic metals.

11. The arrangement according to claim 1, wherein the magnetic circuit has an additional winding.

12. The arrangement according to claim 1, wherein the magnetic circuit surrounds the electrical conductor.

13. The arrangement according to claim 1, wherein the control core comprises a ferrite core.

14. The arrangement according to claim 1, wherein the control core has a rectangular frame and has, on at least one side of the frame, a control winding for the magnetic saturation of the control core.

15. The arrangement according to claim 1, wherein the control core has a control winding on two opposite sides.

16. The arrangement according to claim 1, wherein the magnetic circuit and control core are spaced apart from each other, so that the arrangement has a gap on both sides between the magnetic circuit and the control core.

17. The arrangement according to claim 1, wherein the magnetic-field-sensitive component is a Hall sensor.

18. A method for measuring a current flowing in an electrical conductor, the method comprising:
   coupling a magnetic circuit with the electrical conductor, wherein the magnetic circuit has an air gap and a control core arranged in the air gap for controlling the air gap, measuring a first magnetic field in a case of a saturated control core through one or more magnetic-field-sensitive components arranged in the air gap;

measuring a second magnetic field in a case of an unsaturated control core through the one or more magnetic-field-sensitive component; and eliminating interference influences of external magnetic fields by balancing out the interference influences both for the measurement of the first magnetic field and also for the measurement of the second magnetic field through additional elements that are suitable, independent of the control core, for conducting magnetic fields in surroundings of a magnetic-field-sensitive component.

19. The method according to claim 18, wherein eliminating interference influences further comprises:

increasing a sensitivity for measuring the external magnetic fields in the case of the saturated control core through a first additional element arranged in an interior of the control core.

20. The method according to claim 18, wherein the step of eliminating interference influences further comprises:

balancing out incident angles of the external magnetic fields in the case of the saturated and in the case of the unsaturated control core through both the first additional element arranged in the interior of the control core and also a second additional element arranged outside of the control core.

* * * * *